Aug. 1, 1967 R. A. MANDEVILLE 3,334,275

MULTILAYER CIRCUIT BOARD STRUCTURES

Filed Sept. 29, 1964 2 Sheets-Sheet 1

INVENTOR.
ROBERT A. MANDEVILLE
BY
Edward J. Norl
Attorney

Aug. 1, 1967 R. A. MANDEVILLE 3,334,275

MULTILAYER CIRCUIT BOARD STRUCTURES

Filed Sept. 29, 1964 2 Sheets-Sheet 2

INVENTOR.
ROBERT A. MANDEVILLE
BY
Edward J. Norton
Attorney

United States Patent Office 3,334,275
Patented Aug. 1, 1967

3,334,275

MULTILAYER CIRCUIT BOARD STRUCTURES

Robert A. Mandeville, Byesville, Ohio, assignor to Radio Corporation of America, a corporation of Delaware Filed Sept. 29, 1964, Ser. No. 400,120
4 Claims. (Cl. 317—101)

Figure 1:
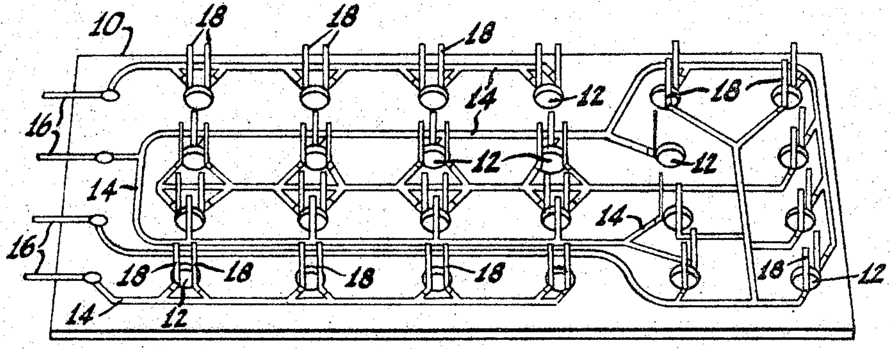

This invention relates to multilayer or laminated circuit board structures; and more particularly to a multilayer board having electrical connections to the conductors appearing between adjacent layers of the board, to the combination of such a board and the modules or other circuit elements connected to the means providing such connections, and to the method of making the multilayer circuit board apparatus.

When a plurality of insulating sheets or layers, each having conductors applied thereon by any known method, are stacked and laminated to provide a multilayer printed circuit board, difficulties arise in making connections from the exterior of the board to the internal conductors thereof, and between the conductors on the several layers. These difficulties arise from the fact that, when a hole is made in the board to expose a portion of an interlayer conductor, there is usually exposed only a thin edge portion of the conductor to which it is difficult to make a connection. Connections have been made to such exposed edges by conductively plating the inside of the hole, or by inserting a hollow or solid rivet in the hole, or by forcing a pin through the hole. The rivet or the pin may be soldered to the exposed edge. However, the resulting connection to the exposed, thin edge of the internal conductor is often unsatisfactory. A connection of a module or other circuit element may be made to the internal conductor by inserting the lead into the hollow rivet or into the plated through-hole and by soldering thereto, or by soldering the lead to the solid pin or rivet. However, the connection to the interior conductor may be damaged by this soldering of the lead, whereby it may be difficult to make a satisfactory board device, and repair or reconstruction thereof may be difficult or impossible. Furthermore, in using plated through-holes or rivets or pins to make connections to inner conductors of a board, a separate hole must be provided for each circuit connection. Also, since the circuit elements or modules project from the board, the resulting apparatus may be bulky.

It is an object of this invention to provide an improved multilayer circuit board and the method of making it.

It is a further object of this invention to provide a multilayer circuit board having simple and reliable connections to the inner conductors thereof.

It is still a further object of this invention to provide an improved connection between modules or other circuit elements comprising a part of circuit apparatus to be mounted on multilayer printed circuit boards and the inner conductors of such boards.

It is an additional object of this invention to provide a multilayer circuit board apparatus of reduced bulk.

Yet another object of this invention is to provide a readily reparable multilayer circuit board apparatus.

In accordance wth this invention, conductors are applied to one side of each of a plurality of insulating layers having holes therethrough, in any known manner, the conductors extending in the vicinity of the holes. A flat side of a conductive tab is welded or otherwise conductively connected to the exposed side of a conductor on a layer near a hole therein. A plurality of tabs may be applied to the conductor or conductors on each layer. Each tab is bent to extend outwardly of the board to which it is fixed. The layers are so stacked that the holes therein register and so that the tabs extend through the registered holes, said one side of each layer being adjacent the other side of another layer, and adhesive being provided between adjacent layers. If desired, a cover layer having no conductors thereon but having holes registering with the holes in the other layers may be so placed on the stack as to cover the exposed conductors. The tabs are long enough so that they extend beyond the stacked layers. The stacked layers may be then laminated in any known manner, as by applying heat and pressure to provide a multilayer circuit board. The tabs, which extend through the holes in the laminated board structure, provide good and reliable connections to the inner conductors of the board. A plurality of tabs may extend through one hole. Where it is desired that the tabs extending through the same hole not contact each other, the tabs may be spaced from each other about the circumference of the hole. The ends of the tabs that extend out of the hole may be bent radially with respect to the center of the hole. Leads of modules or other circuit elements may extend through a hole and be connected to the radially extending tabs. Since a side of each tab is welded or otherwise conductively connected to a side of an internal conductor, a good, sturdy, reliable external connection to the internal conductors is provided which will not be harmed by connection of element leads to the tabs, or by changing of circuit elements for the purpose of repair or redesign.

In a further embodiment of this invention, the cover layer, which may be thicker than the other layers if desired, may have two concentric circles of small holes therethrough for each hole in the other layers. These holes are so positioned that, when the cover layer or cover plate is stacked on the other layers, the tabs may extend through the small holes comprising the outer circle thereof. The circuit elements may be mounted in the holes of the other layers and in contact with the cover plate, the circuit element leads extending through the small holes of the inner circle of holes. The tabs and the leads may be connected together beyond the cover plate from the circuit element. Since the circuit element, or at least a portion thereof if it be a module, extends into the board, the overall thickness or bulk of the circuit board assembly so provided is reduced as compared to the embodiment of the paragraph above.

Figure 2:
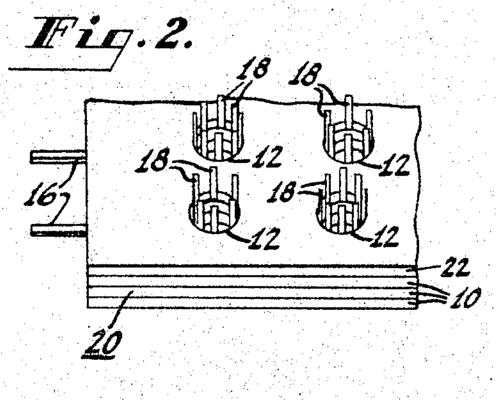
Figure 3:
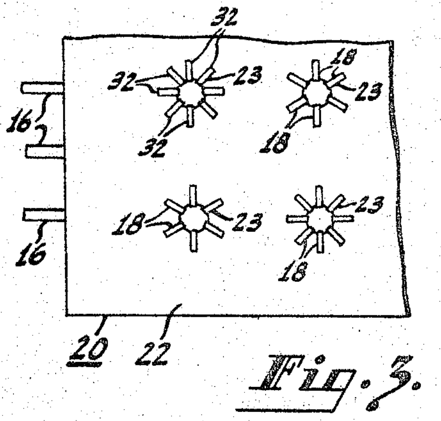
Figure 4:
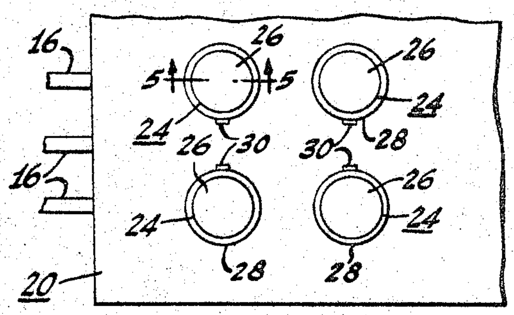
Figure 5:
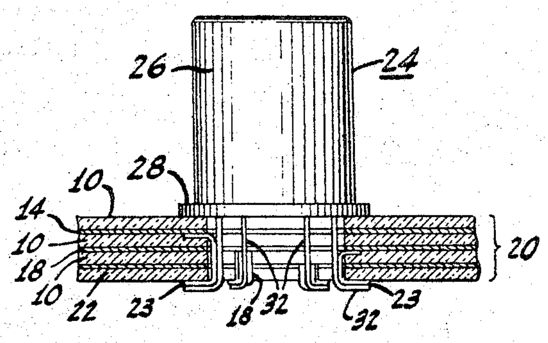
Figure 6:
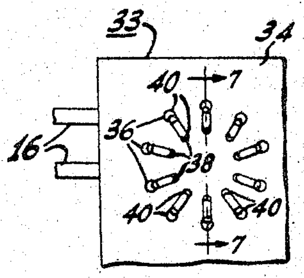
Figure 7:
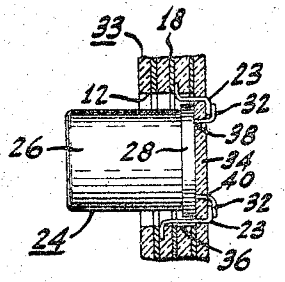

The novel features of this invention, both as to its organization and method of assembly, as well as additional objects and advantages thereof, will be understood more readily from the following description, when read in conjunction with the accompanying drawings in which, FIG. 1 is a perspective view of a single layer of a circuit board according to the present invention, FIG. 2 is a fragmentary, perspective view of a partially completed circuit board in accordance with one embodiment of this invention, FIG. 3 is a fragmentary, plan view of one surface of a completed circuit board of the embodiment illustrated in FIG. 2, FIG. 4 is a fragmentary, plan view of the other surface of the circuit board of FIG. 3, and showing several electronic components mounted therein, FIG. 5 is a sectional view of a portion of the laminated board structure of the circuit board of FIG. 4 with an electronic component thereon, this view being taken on line 5—5 of FIG. 4 and shown on an enlarged scale, FIG. 6 is a fragmentary plan view of another embodiment of this invention and, FIG. 7 is a sectional view taken on the line 7—7 of FIG. 6.

Referring more particularly to FIG. 1, there is provided a layer 10 of insulating material having holes 12 therethrough. Conductors 14 are affixed to one side of the layer 10 in any known manner. These conductors extend from board terminals 16 across the board and in the vicinity of the holes 12 in accordance with a desired circuit design. A flat side of a tab 18, which may be ribbon-like, is connected to an exposed side surface of a conductor 14 in the vicinity of a hole 12, as by welding or soldering. A portion of the tab 18 extends parallel to the side surface of the layer 10 into the area or confines of an adjacent hole 12, and the remaining portion of the tab 18 extends outwardly of the layer 10.

A plurality of layers 10 are provided. The number and position of the conductors 14, of the terminals 16 and of the tabs 18 may vary from layer to layer in accordance with circuit design. All the layers 10, however, are similar in that they have registering holes 12 therethrough and in that the sides of the tabs 18 are welded or otherwise conductively connected to the exposed sides of the conductors 14 on the layers 10, the tabs 18 extending over onto the adjacent holes 12 and then outwardly of the respective layers 10. More than one tab 18 may extend into the confines of the same hole 12, where desired. To prevent contact between several tabs 18 extending through the same hole 12, these tabs 18 may be spaced apart circumferentially of the hole 12 in the confines of which they extend.

To form a laminated circuit board structure 20, adhesive is applied either to the sides of the respective, individual layers 10 to which the conductors 14 are affixed, or to the other sides thereof, or to both. The layers 10 are then stacked, with the holes 12 registering and with the tabs 18 extending in the same direction and through the various holes 12, with said one side of a layer 10 adjacent to the other side of another layer 10. If desired, a cover plate 22, FIG. 2, having no conductors affixed thereto, but having holes 12 therethrough registering with the holes 12 at the other layers 10, may be stacked onto the other layers 10 to provide an insulated outer surface of the board structure 20. Several terminals 16 extend from the edge of the laminated board structure 20, and the tabs 18 extend out of the board structure 20 and beyond the cover layer 22. Where it is not desired that the tabs 16 from the several layers 10 be connected to each other, the tabs 16 are spaced circumferentially of the holes 12, whereby a plurality of independent connections, comprising the tabs 18, to the separate layers of internal conductors 14 may extend through the same hole 12. If necessary, the exposed ends of the tabs 18 may be trimmed to the same length. The stacked layers and the cover plate are made into a laminated circuit board 20 by applying heat and pressure in a known manner. The exposed ends 23 of the tabs 18 are then bent radially outward at the cover plate side of the board 20, as shown in FIGS. 3 and 5. As shown in FIGS. 4 and 5, a circuit element which may be a module 24 comprising a container 26 and having a base 28 and an orienting lug 30 may be mounted with its base 28 on the other side of the board 20 and with its leads 32 extending through the hole 12 and out beyond the cover plate 22. The ends of the leads 32 may be bent radially and conductively connected to the radially extending ends 23 of the tabs 18. The portion of the leads 32 that extend through a hole 12 may be insulated to prevent undesired contact thereof with tabs. A connection of the leads 32 to the various tabs 18 takes place at the exposed side of the cover layer 22, whereby the connection of the tabs 18 to the internal layer 14 is not deleteriously affected by the heat necessary to connect the module leads to the tabs 18, and whereby the circuit elements may readily be changed if repair or redesign is necessary.

In a further embodiment of this invention illustrated in FIGS. 6 and 7, the board 33 differs from the described board 20 in that a modified cover layer or cover plate 34 of insulating material is provided. This cover plate 34 has a plurality of arrays of small holes therethrough each array comprising two circular arrangements 36 and 38 of small holes 40 therethrough so arranged that all the holes comprising the arrays are within the confines or circumference of a hole 12 of the other layers 10. In this embodiment, the tabs 18 that extend through a hole 12 may extend through the small holes 40 of the outer array 36 thereof. The circuit element, here shown as a module 24, may be mounted in the hole 12 in contact with the inner surface of the cover plate 34 and with its leads 32 extending through the holes 40 of the inner array 38 of holes in the cover plate. The exposed ends of the tabs 18 may be bent radially inward of the hole 12 and the exposed ends of the leads 32 may be bent radially outward, and the respective tabs and leads may be connected together by welding or soldering on the other side of the board 20. Since a portion of the module 24 extends into the hole 12, and since other complete circuit elements (not shown) may be within the hole 12, the bulk or overall thickness dimension of the embodiment of the board structure illustrated in FIGS. 6 and 7 is less than that of the embodiment thereof illustrated in FIGS. 1 to 5.

It will undoubtedly be apparent to those skilled in the art that variations in the laminated circuit board structure and the combination thereof with the modules and circuit elements described above, as well as in the method of making it, is possible within the spirit of the present invention. For example, either the cover layer 22 or the cover plate 34 may be grooved for the reception for the radial portions 23 of the tabs 18, to provide even thinner module board combinations. Also, conductive material may be fixed to the cover layer or cover plate at the bottoms of the grooves and the tab ends 23 may be fixed to this material and therefore to the board, as by welding or soldering, to hold the tabs in their radial positions. The tabs may extend out of the board at the side thereof opposite the cover layer. Or, certain of the tabs may extend in one direction through the board and others extend in the opposite direction, and components may be mounted in either or both sides of the board. Other changes within the spirit of this invention will, no doubt readily suggest themselves. Hence, it should be understood that the foregoing description is to be taken as illustrative and not in a limiting sense.

What is claimed is:

1. A laminated circuit board comprising a plurality of insulating layers having registering holes therethrough, a conductor on one surface of each of said layers in the vicinity of said holes therethrough, at least one tab having a side surface for each of said layers, the side of each tab being conductively connected to a side of a conductor on a layer and in the vicinity of a hole therethrough, a cover layer of insulating material also having holes therethrough in registry with the holes in said insulating layers, said tabs extending out of said board through at least one hole in said cover layer, the portion of the tabs beyond the cover layer extending radially of the center of the hole through which the tabs extend, and a circuit element having at least one lead, said lead extending through said one of said holes, the portion of said lead beyond said cover layer portion of said board extending radially of the hole through which said lead extends, said radial portion of said lead and of one of said tabs being electrically connected.

2. A laminated circuit board comprising (a) a plurality of insulating layers having registering holes therethrough, (b) conductors on one surface of each of said layers in the vicinity of said holes therethrough, (c) at least one tab having a side surface for each of said layers, the side of each tab being conductively connected to a side of a conductor on a layer and in the vicinity of registering hole therethrough, (d) a cover layer of insulating material also having holes therethrough in registry with the holes in said insulating layers,
(e) said tab extending out of said board through the corresponding hole in said cover layer,
(f) said tabs being spaced from each other around the circumference of the hole through which they exend,
(g) the portion of said tabs beyond said cover layer extending radially of the center of the hole through which said tabs extend,
(h) a circuit element having leads, said leads extending through said hole, said circuit element being mounted on the side of said board opposite said cover layer, said leads being connected to said tabs.

3. A laminated circuit board comprising
(a) a plurality of insulating layers having registering holes therethrough,
(b) conductors on one surface of each of said layers in the vicinity of said holes therethrough,
(c) at least one tab having a side surface for each of said layers, the side of each tab being conductively connected to a side of a conductor on its layer and in the vicinity of a hole therethrough,
(d) said tabs extending through said holes in the same direction with respect to said board,
(e) a cover layer of insulating material having a plurality of small holes arranged within the confines of said registering holes through said insulating layers,
(f) a tab extending through one of said small holes,
(g) a circuit element having a lead, said circuit element being mounted in said registering holes in said insulating layers, said lead extending through another of said small holes and being connected to said tab.

4. A laminated circuit board comprising
(a) a plurality of insulating layers having registering holes therethrough,
(b) conductors on one surface of each of said layers in the vicinity of said registering holes therethrough,
(c) at least one tab for each of said layers, a side of each tab being conductively connected to a side of a conductor on its layer and in the vicinity of a hole therethrough,
(d) said tabs extending through said holes in the same direction with respect to said board,
(e) a cover layer of insulating material having a first plurality of small holes arranged within the confines of said registering holes through said insulating layers,
(f) a tab extending through each of said first plurality of small holes,
(g) a second plurality of small holes extending through said cover layer within the confines of said registering holes through said insulating layer,
(h) a circuit element having leads, said circuit element being mounted in said registering holes through said insulating layers with said leads extending through said second plurality of small holes, said leads and said tabs being connected together at the side of said cover plate opposite said circuit element.

References Cited

UNITED STATES PATENTS

| | | | |
|---|---|---|---|
| 1,718,993 | 7/1929 | Wermine | 317—101 X |
| 2,862,992 | 12/1958 | Franz | 174—52 |
| 3,151,278 | 9/1964 | Elarde | 174—68 X |

DARRELL L. CLAY, *Primary Examiner.*